United States Patent [19]
Asokan

[11] Patent Number: 5,933,059
[45] Date of Patent: Aug. 3, 1999

[54] METHOD AND APPARATUS FOR CONTROLLING FREQUENCY SYNCHRONIZATION IN A RADIO TELEPHONE

[75] Inventor: Ramanathan Asokan, Cary, N.C.

[73] Assignee: Ericsson Inc., Research Triangle Park, N.C.

[21] Appl. No.: 08/956,163

[22] Filed: Oct. 22, 1997

[51] Int. Cl.$^6$ ................................................. H04L 27/06
[52] U.S. Cl. ................. 331/18; 375/344; 455/164.1; 455/164.2; 455/258; 455/259; 455/260; 327/146
[58] Field of Search ........................... 455/258, 259, 455/260, 164.1, 164.2, 165.1; 331/17, 18; 375/344; 327/146

[56] References Cited

U.S. PATENT DOCUMENTS

| | | |
|---|---|---|
| 5,165,051 | 11/1992 | Kumar . |
| 5,495,506 | 2/1996 | Shoji ........................................ 375/344 |
| 5,509,034 | 4/1996 | Beukema ................................ 375/344 |
| 5,628,060 | 5/1997 | Yoon ..................................... 455/183.2 |

FOREIGN PATENT DOCUMENTS

| | | |
|---|---|---|
| 0 629 041 | 6/1994 | European Pat. Off. . |
| 2 308 931 | 7/1997 | United Kingdom . |
| WO 96/03827 | 2/1996 | WIPO . |

OTHER PUBLICATIONS

European Patent Office, Standard Search Report, Mar. 20, 1998 RS 100213 US.

*Primary Examiner*—Arnold Kinkead
*Attorney, Agent, or Firm*—Jenkens & Gilchrist, P.C.

[57] ABSTRACT

A method and apparatus for controlling frequency synchronization in a frequency correction feedback loop of a radio telephone. A processor in a frequency update controller ascertains increment/decrement values pro-proportionally related to confidence levels representing a ratio that a likelihood probability of estimated offset frequecies of an input carrier signal are accurate in proportion to a likelihood probability that the estimated offset frequencies are inaccurate. The processor adds or subtracts the value to a counter depending on its sign. When the counter reaches a certain predefined positive number, the counter is decremented by this number and the processor increases the frequency of a reference oscillator frequency. When the counter reaches a certain predefined negative number, the counter is incremented by the absolute value of the negative number and the processor decreases the frequency of the reference oscillator frequency.

9 Claims, 2 Drawing Sheets

METHOD AND APPARATUS FOR CONTROLLING FREQUENCY SYNCHRONIZATION IN A RADIO TELEPHONE

BACKGROUND OF THE INVENTION

1. Technical Field of the Invention

The present invention pertains in general to the synchronization of a radio receiver to a carrier signal frequency and, more particularly, to a method and apparatus for controlling a frequency correction feedback loop in a radio telephone.

2. Description of Related Art

While in idle mode, a radio telephone periodically monitors a carrier signal associated with a communication channel in order to maintain frequency synchronization with the carrier signal. The carrier signal frequency, however, often varies by an offset frequency which is introduced from a variety of sources. Some of the sources are external to the radio telephone and include frequency offsets due to Doppler shifts and tolerance variations in equipment transmitting the carrier signal. On the other hand, other frequency offsets are introduced by the radio telephone itself. These sources include frequency offsets from the reference oscillator and a frequency estimator used in a frequency correction feedback loop.

Referring now to FIG. 1 there is illustrated a functional block diagram of a frequency correction feedback loop currently used in radio telephone equipment. An input carrier signal of frequency $f_c$ including an external offset frequency error $\pm f_{e1}$ enters a mixer 100 and is mixed with an output signal of the frequency correction feedback loop. The output signal of the frequency correction feedback loop includes an estimation of the input signal frequency $f_c \pm f_{e1}$ and an internal offset frequency error $\pm f_{e1} \pm f_{e2}$ which is introduced due to errors in the frequency control feedback loop. A primary source of the internal offset frequency error $\pm f_{e1} \pm f_{e2}$ is a frequency estimator 110.

The frequency estimator 110 estimates the offset signal frequency $\pm f_{e1} \pm f_{e2}$ and produces an offset frequency $f_o$ which is an estimation of the difference between the actual carrier signal frequency and an internally generated synchronization frequency. The offset frequency $f_o$ is applied to a temperature compensated reference oscillator (TCXO) 120 and controls the reference oscillator output frequency. The output signal of the reference oscillator 120 is applied to a frequency synthesizer 130 which generates the output signal $f_c \pm f_{e2}$ of the frequency correction feedback loop.

Various approaches have used in an attempt to minimize the offset frequency error $\pm f_{e1} \pm f_{e2}$. A first approach has been to use a more accurate frequency estimator 110 which provides a more accurate estimation. This approach, however, increases the complexity and cost of the radio telephone. A second approach has been to make a series of estimates over many bursts and then average the estimates to reduce variances in the individual estimates. Performing estimates over many bursts, however, also increases the complexity of the radio telephone and, moreover, increases power consumption in the radio telephone. A third approach involves decreasing the frequency step size of the reference oscillator 120. By reducing the frequency step size, the frequency of the reference oscillator 120 can be increased or decreased by numerous small steps in frequency. This results in a trial and error approach to arrive at the step size. This approach, however, drastically increases the complexity of the radio equipment as a result of the complex process involved in analyzing all the possible frequency combinations.

For the foregoing reasons, it would be advantageous to devise a method and apparatus which decreases the error in an estimated offset frequency generated by a frequency estimator in a frequency correction feedback loop of a radio telephone. Furthermore, it would be advantageous if such a method and apparatus did not substantially increase the complexity or power consumption of the radio telephone.

SUMMARY OF THE INVENTION

The present invention comprises a method and apparatus for controlling frequency synchronization in a frequency correction feedback loop of a radio telephone. A processor in a frequency update controller ascertains increment/decrement values proportionally related to confidence levels representing a ratio that a likelihood probability of estimated offset frequencies of an input carrier signal are accurate in proportion to a likelihood probability that the estimated offset frequencies are inaccurate.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
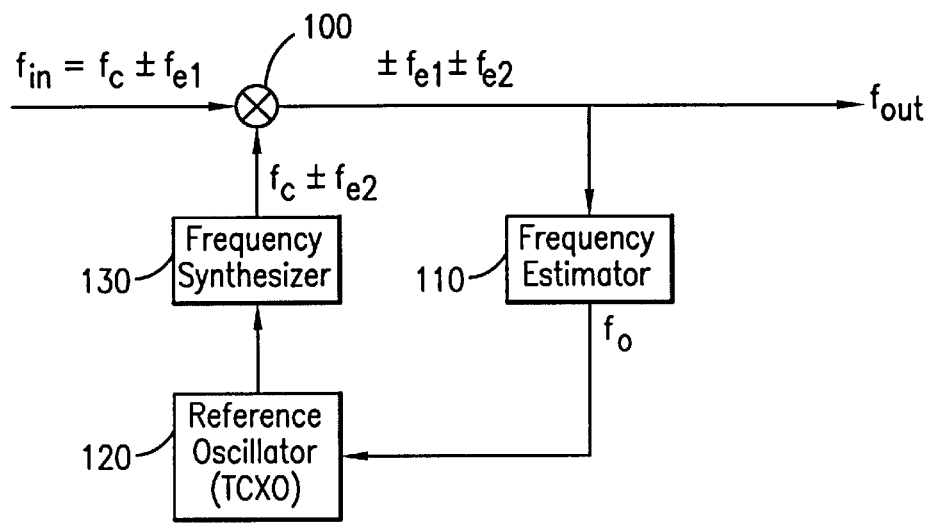
FIG. 1, previously described, is a functional block diagram of a frequency correction feedback loop currently used in radio telephone equipment.
Figure 2:
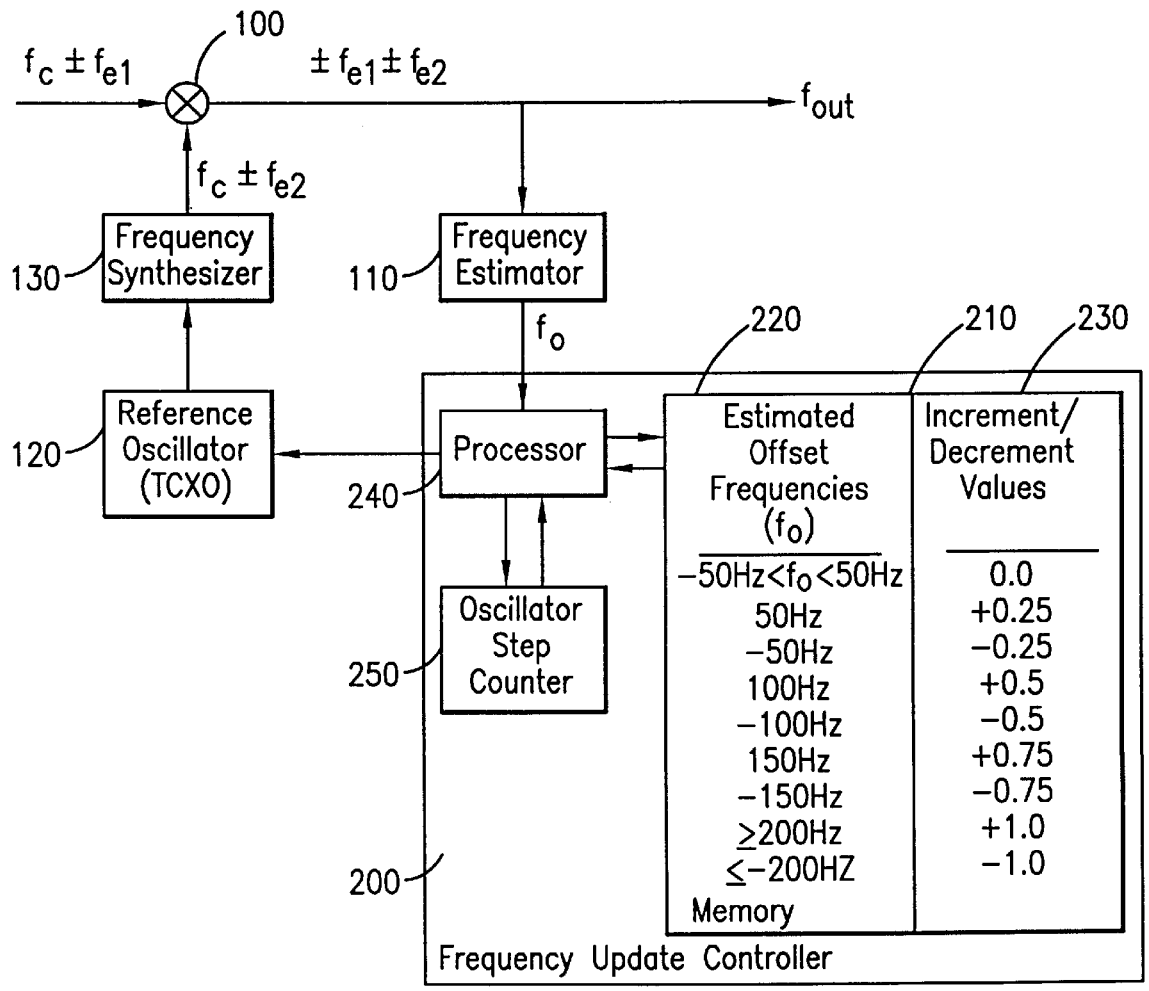
FIG. 2 is a functional block diagram of a frequency correction feedback loop incorporating the present invention.

Referring now to FIG. 2, there is illustrated a functional block diagram of a frequency correction feedback loop incorporating the present invention. An input carrier signal having a frequency fc including an external offset frequency $\pm f_{e1}$ enters a mixer 100 and is mixed with an output signal of frequency $f_c \pm f_{e2}$ of the frequency correction feedback loop. The frequency correction feedback loop comprises a frequency estimator 110, a frequency update controller 200, a temperature compensated reference oscillator (TCXO) 120 and a frequency synthesizer 130. The operation of frequency estimators 110 is well known in the industry, but in general, the output signal of the mixer 100 is applied to the estimator 110 and the estimator 110 estimates an offset frequency $f_o$. In past implementations of frequency correction feedback loops, the offset frequency $f_o$ is applied to the reference oscillator 120 and controls the frequency of the signal output by the reference oscillator 120. The present invention, however, incorporates the frequency update controller 200 which determines a ratio that the likelihood probability of the offset frequency $f_o$ is accurate in proportion to the likelihood probability of the offset frequency $f_o$ is inaccurate and sends a signal to the reference oscillator 120 to adjust the output frequency of the reference oscillator based on the ratio. The output signal of the reference oscillator enters a frequency synthesizer 130 which generates the output signal $f_c \pm f_{e2}$ of the frequency correction feedback loop.

Given a frequency estimator design, parameters pertaining to the performance and accuracy of the frequency estimator 110 can be measured or estimated. Although the performance parameters vary according to the particular frequency estimator design being used, certain characteristics are common across all frequency estimators. In general, the accuracy of the frequency estimator 110 can be represented by a bell curve which represents the probability that the offset frequency $f_o$ is inaccurate as well as accurate. On a graph, the bell curve plots the probability that the offset frequency is inaccurate along a vertical axis with respect to frequencies plotted along a horizontal axis. The bell curve has a peak positioned at zero hertz which is an accurate frequency point and tails off to the right as the frequency increases in a positive direction and tails off to the left as the frequency increases in a negative direction. The positive frequencies represent an offset frequency which is to be added to the reference oscillator while the negative frequencies represent an offset frequency which is to be subtracted to the reference oscillator to achieve synchronization with the actual carrier signal frequency.

In general, small offset frequencies, both above and below zero hertz, are more likely to be caused by an error in the frequency estimator 110 while larger offset frequencies are less and less likely to be caused by an error in the frequency estimator 110 as the frequency increases. Thus, it is less likely that small offset frequencies need to be added to the reference oscillator to achieve synchronization while it is more likely that larger offset frequencies need to be added to the reference oscillator to achieve synchronization.

Given the performance parameters of the frequency estimator 110, a processor 240 within the frequency update controller 200 calculates a confidence level representing the ratio that the likelihood probability of the offset frequency $f_o$ from the frequency estimator 110 is accurate in proportion to the likelihood probability that the offset frequency $f_o$ is inaccurate. Based on the level of confidence, the processor 240 ascertains an increment or decrement value and adjusts the frequency of the reference oscillator 120 accordingly. Although the processor 240 could continuously calculate an increment/decrement value and adjust the frequency of the reference oscillator 120 this is not the preferred embodiment.

In the preferred embodiment the frequency update controller 200 includes the processor 240, a memory 210 including a look-up table listing a set of estimated offset frequencies 220 and associated increment/decrement values 230, and an oscillator step counter 250. In the preferred embodiment the processor 240 receives the offset frequency $f_o$ from the frequency estimator 120 and looks up the increment/decrement value associated with the offset frequency $f_o$ in the look-up table contained in the memory 210. The values in the memory are calculated at a prior time and stored in the memory 210. The processor 240 increments or decrements the oscillator step counter 250, which is initially set to a zero value, by an amount equal to the increment/decrement value.

The look-up table shown in FIG. 2 lists a set of estimated offset frequencies 220 and associated increment/decrement values 230 which illustrate the confidence level relationship between the set of estimated offset frequencies 220 and the increment/decrement values 230. The values in the look-up table are provided for illustrative purposes and do not necessarily represent a particular frequency estimator design. They are intended to show the relationship between offset frequencies and increment/decrement values. In this example, offset frequencies $f_o$ between negative fifty hertz and positive fifty hertz are most likely to be caused by errors introduced by the frequency estimator 110 and are, therefore, assigned a value of zero. At the other end of the spectrum, offset frequencies $f_o$ greater than or equal to two hundred hertz or less than or equal to minus two hundred hertz are least likely to be caused by errors introduced by the frequency estimator 110 and are, therefore, assigned a value of plus or minus one respectively. Values in between are associated with various confidence levels representing the ratio that the likelihood probability of the offset frequency $f_o$ from the frequency estimator 110 is accurate in proportion to the likelihood probability that the offset frequency $f_o$ is inaccurate. The various confidence levels are assigned increment/decrement values accordingly. The look-up table depicted in FIG. 2 uses a granularity of frequencies of fifty hertz and increment/decrement values of twenty five hundredths. It is understood, however, that the look-up table can use any level of granularity and is customized for the particular frequency estimator design.

In the preferred embodiment, the oscillator step counter 250 is incremented or decremented by the increment/decrement value associated with each received offset frequency estimate and the reference oscillator is incremented or decremented only when the oscillator step count reaches a plus one or a minus one accordingly. Therefore, as an example, four consecutive offset frequency estimates of fifty to ninety nine hertz are required to increment the reference oscillator 120 whereas, only one estimate of two hundred hertz or greater is required to increment the reference oscillator 120.

Figure 3:
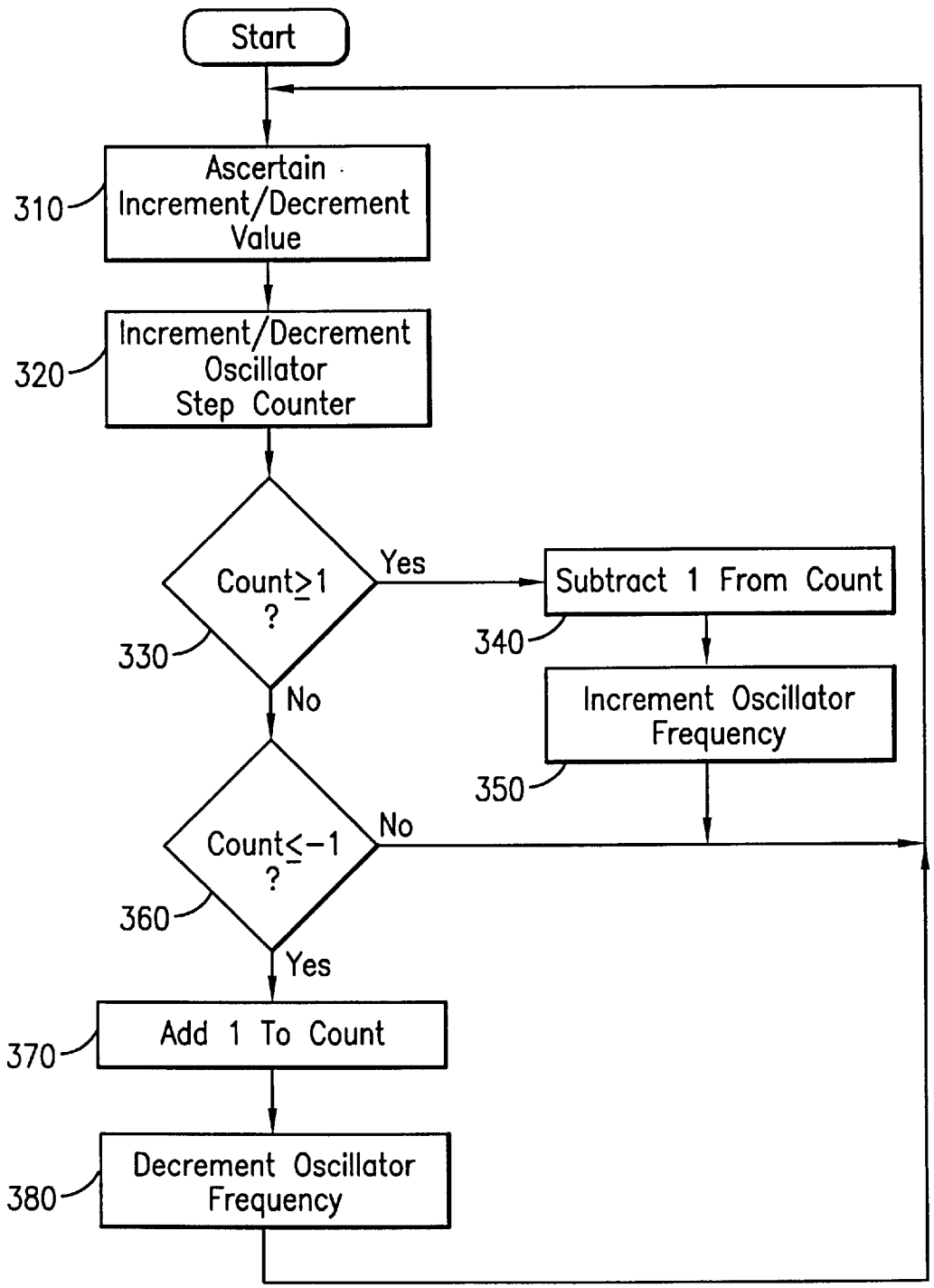
FIG. 3 is a method for controlling frequency synchronization consistent with the present invention.

Referring additionally now to FIG. 3 there is illustrated a method for controlling frequency synchronization consistent with the present invention. After receiving estimated offset frequencies from the frequency estimator 240, associated increment/decrement values are ascertained based on confidence levels that represent the ratio that the likelihood probability of the estimated offset frequencies are accurate in proportion to the likelihood probability that the offset frequencies are inaccurate (step 310). The oscillator step counter 250, initially set to a zero value, is incremented or decremented by the ascertained increment/decrement value (step 320) by the processor 240. A determination is then made as to whether the count on the oscillator step counter 250 is greater than or equal to one (step 330). If the count is greater than or equal to one, the oscillator step counter 250 is decremented by one (step 340) and the frequency of the reference oscillator 120 is incremented (step 350). The process is then repeated beginning with step 310. If, in step 330, it was determined that the count was not greater than or equal to one, a determination is made as to whether the count is less than or equal to minus one (step 360). If not, the process is repeated beginning with step 310. Otherwise, a value of one is added to the oscillator step counter 250 (step 370), the frequency of the reference oscillator 120 is decremented (step 380) and the process is repeated beginning with step 310. Although the preferred embodiment uses counter values in a range between negative one and positive one, it is understood that the present invention also includes other ranges of values.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A method for controlling frequency synchronization comprising the steps of:

estimating an offset frequency of an input carrier signal;

determining a confidence level representing a ratio that a likelihood probability of the estimated offset frequency of the input carrier signal is accurate in proportion to a likelihood probability that the estimated offset frequency is inaccurate wherein the confidence level is based on performance parameters of a frequency estimator which performs the estimation;

ascertaining an increment/decrement value associated with the confidence level; and incrementing/decrementing a reference oscillator frequency in accordance with the increment/decrement value.

2. The method recited in claim 1 wherein the step of ascertaining the increment/decrement value comprises the step of looking up the value in a look-up table, the look-up table containing a list of increment/decrement values associated with estimated offset frequencies with the increment/decrement values representing the ratio that the likelihood probability of the estimated offset frequencies of the input carrier signal are accurate in proportion to the likelihood probability that the estimated offset frequencies are inaccurate.

3. The method recited in claim 1 wherein the step of incrementing/decrementing the reference oscillator frequency comprises the steps of:

incrementing/decrementing a counter by the increment/decrement value;

incrementing the reference oscillator frequency when the counter reaches a first count;

decrementing the counter by the first count when the counter reaches the first count;

decrementing the reference oscillator frequency when the counter reaches a second count; and incrementing the counter by an absolute value of the second count when the counter reaches the second count.

4. The method recited in claim 3 further including the step of initially setting the counter to a zero value.

5. Apparatus for controlling frequency synchronization comprising:

a frequency estimator for estimating an offset frequency of an input carrier signal;

a processor for determining a confidence level representing a ratio that a likelihood probability of the estimated offset frequency of the input carrier signal is accurate in proportion to a likelihood probability that the estimated offset frequency is inaccurate wherein the confidence level is based on performance parameters of the frequency estimator;

means for ascertaining a value to increment or decrement a reference oscillator frequency based on the confidence level; and a frequency update controller for adjusting the reference oscillator frequency in accordance with the ascertained value.

6. The apparatus recited in claim 5, wherein the means for ascertaining the value comprises a look-up table which associates a plurality of values with a respective plurality of estimated offset frequencies, the plurality of values representing the ratio that the likelihood probability of the plurality of estimated offset frequencies of the input carrier signal are accurate in proportion to the likelihood probability that the plurality of estimated offset frequencies are inaccurate.

7. The apparatus recited in claim 6, further including a memory for storing the look-up table.

8. The apparatus recited in claim 5, wherein the frequency update controller further comprises an up/down counter, the counter for counting up and down by the ascertained value.

9. The method as recited in claim 1 wherein the steps of estimating, determining, ascertaining and incrementing/decrementing are continually repeated.

* * * * *